(12) United States Patent
Machida

(10) Patent No.: US 11,171,081 B2
(45) Date of Patent: Nov. 9, 2021

(54) WIRING SUBSTRATE, SEMICONDUCTOR PACKAGE AND METHOD OF MANUFACTURING WIRING SUBSTRATE

(71) Applicant: SHINKO ELECTRIC INDUSTRIES CO., LTD., Nagano (JP)

(72) Inventor: Tomoaki Machida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/811,731

(22) Filed: Mar. 6, 2020

(65) Prior Publication Data

US 2020/0303293 A1     Sep. 24, 2020

(30) Foreign Application Priority Data

Mar. 20, 2019   (JP) .............................. JP2019-053623

(51) Int. Cl.
*H01L 23/498*     (2006.01)
*H01L 23/00*      (2006.01)
*H01L 21/48*      (2006.01)

(52) U.S. Cl.
CPC .... *H01L 23/49822* (2013.01); *H01L 21/4857* (2013.01); *H01L 23/49811* (2013.01); *H01L 23/49838* (2013.01); *H01L 24/16* (2013.01); *H01L 2224/16227* (2013.01)

(58) Field of Classification Search
CPC ........... H01L 23/49822; H01L 21/4857; H01L 23/49811; H01L 23/49838; H01L 24/16; H01L 2224/16227
See application file for complete search history.

(56) References Cited

U.S. PATENT DOCUMENTS

| 2013/0008705 | A1* | 1/2013 | Tseng .................. H01L 21/4857 |
| | | | 174/266 |
| 2017/0103942 | A1 | 4/2017 | Oi et al. |
| 2018/0005931 | A1* | 1/2018 | Chen ...................... H01L 23/562 |
| 2018/0019197 | A1* | 1/2018 | Boyapati ........... H01L 23/49838 |
| 2018/0374803 | A1* | 12/2018 | Aoki ...................... H01L 23/645 |
| 2019/0206774 | A1* | 7/2019 | Rosch ................. H01L 21/4857 |
| 2020/0075468 | A1* | 3/2020 | Arvin ................ H01L 23/49838 |
| 2020/0266149 | A1* | 8/2020 | Xu ....................... H01L 25/0655 |
| 2021/0098357 | A1* | 4/2021 | Huang .................. H05K 1/113 |

FOREIGN PATENT DOCUMENTS

JP          2017-73520          4/2017

* cited by examiner

*Primary Examiner* — Douglas W Owens
(74) *Attorney, Agent, or Firm* — Rankin, Hill & Clark LLP

(57) ABSTRACT

A second wiring layer is connected to a first wiring layer via an insulating layer. The second wiring layer comprises pad structures. Each pad structure includes a first metal layer formed on the insulating layer, a second metal layer formed on the first metal layer, and a third metal layer formed on the second metal layer. The pad structures comprises a first pad structure and a second pad structure. A via-wiring diameter of the first pad structure is different from a via-wiring diameter of the second pad structure. A distance from an upper surface of the insulating layer to an upper surface of the second metal layer of the first pad structure is the same as a distance from the upper surface of the insulating layer to an upper surface of the second metal layer of the second pad structure.

6 Claims, 5 Drawing Sheets

WIRING SUBSTRATE, SEMICONDUCTOR PACKAGE AND METHOD OF MANUFACTURING WIRING SUBSTRATE

CROSS-REFERENCE TO RELATED APPLICATIONS

This application is based upon and claims the benefit of priority from prior Japanese patent application No. 2019-053623, filed on Mar. 20, 2019, the entire contents of which are incorporated herein by reference.

TECHNICAL FIELD

The present disclosure relates to a wiring substrate, a semiconductor package and a method of manufacturing a semiconductor package.

BACKGROUND ART

Known is a wiring substrate including a first wiring layer, a first insulating layer configured to cover the first wiring layer, and a second wiring layer connected to the first wiring layer via the first insulating layer. In the wiring substrate, the second wiring layer has a plurality of pad structures each of which has a via-wiring formed in the first insulating layer, and a first pad for semiconductor chip connection formed integrally with the via-wiring on an upper surface of the first insulating layer, for example.

The pad structures may be formed by following processes, for example. First, a first insulating layer for covering a first wiring layer is formed, and the first insulating layer is formed with via-holes for exposing an upper surface of the first wiring layer. Then, a seed layer is continuously formed on a surface of the first insulating layer including inner walls of the via-holes and on a surface of the first wiring layer exposed in the via-holes.

Subsequently, a resist pattern having opening portions each conforming to a shape of the first pad is formed on the seed layer, and an electrolytic plated layer is formed on the seed layer exposed in the opening portions of the resist pattern by an electrolytic plating method of feeding power from the seed layer. Thereafter, the resist pattern is removed.

Then, an etching is performed by using the electrolytic plated layer as a mask, so that the seed layer exposed from the electrolytic plated layer is removed. Thereby, a plurality of pad structures each having a via-wiring and a first pad integrally formed with the via-wiring is formed.

[PTL 1] JP-A-2017-73520

However, opening diameters of the via-holes in the respective pad structures may not be uniform. In this case, a filling time (a time for which a via-wiring is formed) of the electrolytic plating is shorter in the small-diameter via-holes than in the large-diameter via-holes. Since the first pad is formed integrally with the via-wiring on the via-wiring filling the via-hole, a height of the first pad is relatively high in the small-diameter via-hole and is relatively low in the large-diameter via-hole. That is, when the opening diameters of the via-holes are not uniform, the heights of the first pads are also not uniform, so that connection reliability upon interconnection of the first pads and the semiconductor chip is lowered.

For example, for a portion in which the height of the first pad is low, when connection is made by soldering, an interval between the first pad and an electrode pad of the semiconductor chip increases, so that an amount of soldering necessary for connection is not enough for connection and an open detect may thus occur. Also, for a portion in which the height of the first pad is high, when connection is made by soldering, the interval between the first pad and the electrode pad of the semiconductor chip decreases, so that an excessive amount of solder flows laterally to connect the first pads adjacent to each other and a short defect may thus occur.

SUMMARY OF INVENTION

Aspect of non-limiting embodiments of the present disclosure is to provide a wiring substrate, a semiconductor package and a method of manufacturing a semiconductor package, which can improve connection reliability of pads for semiconductor chip connection and a semiconductor chip upon connection with the semiconductor chip.

A wiring substrate according to non-limiting embodiment of the present disclosure comprises:

a first wiring layer;

an insulating layer formed to cover the first wiring layer; and a second wiring layer connected to the first wiring layer via the insulating layer, wherein the second wiring layer comprises a plurality of pad structures, each of the pad structures including a via-wiring and a pad for semiconductor chip connection, the via-wiring filled in a via-hole, the via hole penetrating the insulating layer and formed to expose an upper surface of the first wiling layer, the pad for semiconductor chip connection formed on an upper surface of the insulating layer and integrally formed with the via-wiring, wherein each of the pad structures comprises:

a first metal layer continuously formed on the upper surface of the insulating layer, on an inner wall surface of the via-hole, and on the upper surface of the first wiring layer exposed in the via-hole, a second metal layer formed on the first metal layer, filling the via-hole, extending upwardly beyond the upper surface of the insulating layer, and having an upper surface being flat, and a third metal layer formed on an upper surface of the second metal layer, wherein the plurality of pad structures comprises a first pad structure and a second pad structure, and a via-wiring diameter of the first pad structure is different from a via-wiring diameter of the second pad structure, and wherein a distance from the upper surface of the insulating layer to the upper surface of the second metal layer of the first pad structure is the same as a distance from the upper surface of the insulating layer to the upper surface of the second metal layer of the second pad structure.

According to the disclosed technology, in the wiring substrate including pads for semiconductor chip connection, it is possible to improve connection reliability of the pads and the semiconductor chip upon connection with the semiconductor chip.

DETAILED DESCRIPTION OF EMBODIMENTS

Figure 1A:
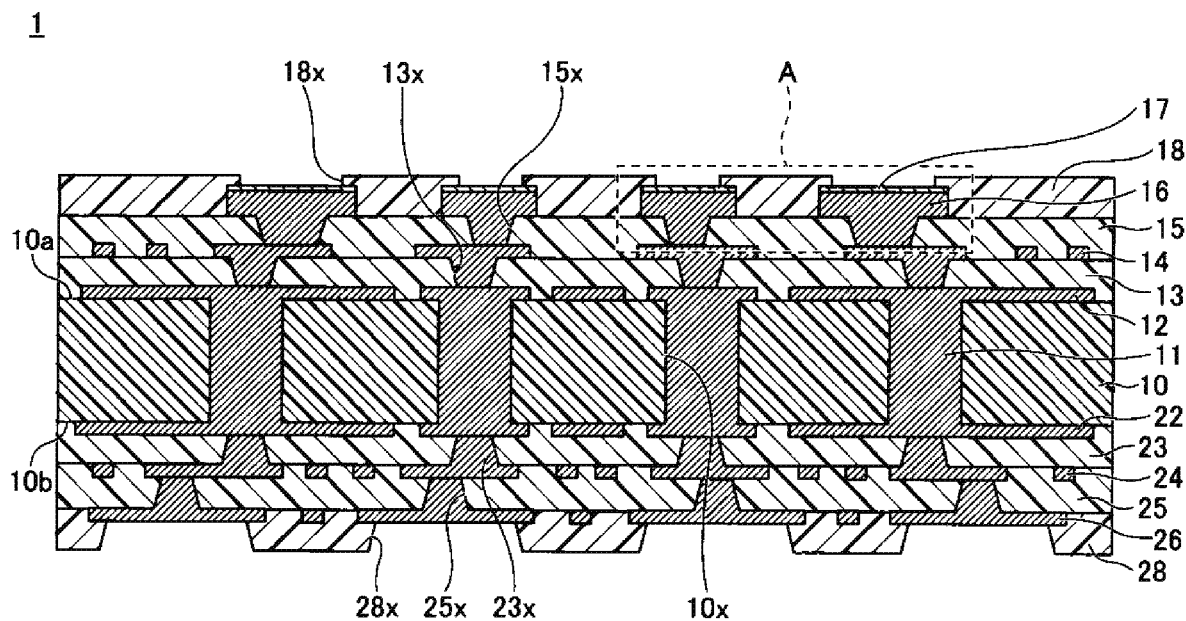
FIGS. 1A and 1B are sectional views exemplifying a wiring substrate in accordance with a first embodiment.

Hereinbelow, embodiments of the present disclosure will be described with reference to the drawings. Meanwhile, in the respective drawings, the same constitutional parts are denoted with the same reference numerals, and the overlapping descriptions thereof may be omitted.

First Embodiment

[Structure of Wiring Substrate of First Embodiment]

Figure 1B:
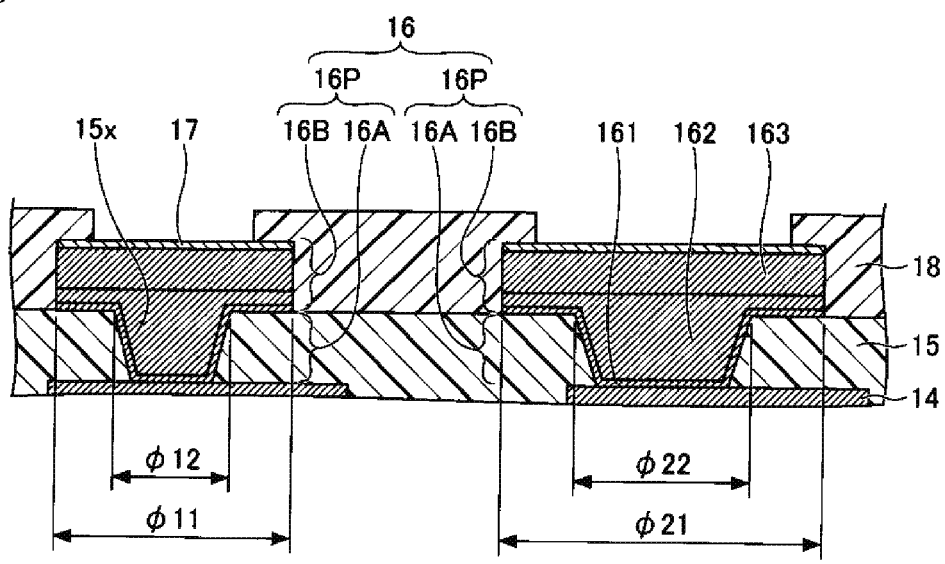

First, a structure of a wiring substrate of a first embodiment is described. FIGS. 1A and 1B are sectional views exemplifying the wiring substrate in accordance with the first embodiment, in which FIG. 1A is an overall view and FIG. 1B is a partially enlarged view.

Referring to FIG. 1A, the wiring substrate 1 is a wiring substrate in which wiring layers and insulating layers are stacked on both sides of a core layer 10.

Specifically, in the wiring substrate 1, a wiring layer 12, an insulating layer 13, a wiring layer 14, an insulating layer 15, a wiring layer 16, a surface-treated layer 17, and a solder resist layer 18 are sequentially stacked on one surface 10a of the core layer 10. Also, a wiring layer 22, an insulating layer 23, a wiring layer 24, an insulating layer 25, a wiring layer 26, and a solder resist layer 28 are sequentially stacked on the other surface 10h of the core layer 10. In the meantime, the solder resist layers 18 and 28 are layers that are optionally provided, as required. That is, the formation of the solder resist layers 18 and 28 is not necessarily required.

Meanwhile, in the first embodiment, for convenience sake, the solder resist layer 18-side of the wiring substrate 1 is referred to as 'upper side' or 'one side', and the solder resist layer 28-side is referred to as 'lower side' or 'other side'. Also, a surface of each part facing toward the solder resist layer 18 is referred to as 'one surface' or 'upper surface', and a surface facing toward the solder resist layer 28 is referred to as 'other surface' or 'lower surface'. However, the wiring substrate 1 can be used with being vertically reversed or can be arranged at any angle. Also, the description 'as seen from above' indicates that a target object is seen in a normal direction of one surface 10a of the core layer 10, and a planar shape indicates a shape of the target object as seen from the normal direction of one surface 10a of the core layer 10.

As the core layer 10, for example, a so-called glass epoxy substrate where an insulating resin such as an epoxy-based resin is impregnated in glass cloth may be used. As the core layer 10, a substrate where an epoxy-based resin, a polyimide-based resin or the like is impregnated in woven fabric or non-woven fabric of glass fiber, carbon fiber, aramid fiber and the like may also be used. A thickness of the core layer 10 may be set to about 60 to 400 μm, for example. The core layer 10 is formed with through-holes 10x penetrating the core layer 10 in a thickness direction. A planar shape of the through-hole 10x is circular, for example.

The wiring layer 12 is formed on one surface 10a of the core layer 10. Also, the wiring layer 22 is formed on the other surface 10b of the core layer 10. The wiling layer 12 and the wiring layer 22 are electrically interconnected by through-wirings 11 formed in the through-holes 10x. The wiring layers 12 and 22 are respectively patterned into a predetermined planar shape. For the wiring layers 12 and 22 and the through-wiring 11, copper (Cu) or the like may be used, for example. A thickness of each of the wiring layers 12 and 22 may be set to about 10 to 30 μm, for example. In the meantime, the wiring layer 12, the wiring layer 22 and the through-wirings 11 may also be integrally formed.

The insulating layer 13 is formed on one surface 10a of the core layer 10 so as to cover the wiring layer 12. As a material of the insulating layer 13, for example, a non-photosensitive thermosetting resin of which a main component is an epoxy-based resin, a polyimide-based resin or the like may be used. As a material of the insulating layer 13, for example, a photosensitive resin of which a main component is an epoxy-based resin, an acryl-based resin or the like may also be used. A thickness of the insulating layer 13 may be set to about 30 to 40 μm, for example. The insulating layer 13 may contain a filler such as silica ($SiO_2$).

The wiring layer 14 is formed on one side of the insulating layer 13. The wiring layer 14 includes via-wirings filled in via-holes 13x penetrating the insulating layer 13 and formed to expose an upper surface of the wiring layer 12, and a wiling pattern formed on an upper surface of the insulating layer 13. The wiring pattern of the wiring layer 14 is electrically connected to the wiring layer 12 through the via-wirings. The via-hole 13x is a concave portion having an inverted conical shape of which a diameter of an opening portion opened toward the insulating layer 15 is larger than a diameter of a bottom surface of an opening portion formed by the upper surface of the wiring layer 12. A material of the wiring layer 14 and a thickness of the wiring pattern are similar to those of the wiring layer 12, for example.

The insulating layer 15 is formed on the upper surface of the insulating layer 13 so as to cover the wiring layer 14. A material and a thickness of the insulating layer 15 are similar to those of the insulating layer 13, for example. The insulating layer 15 may contain a filler such as silica ($SiO_2$).

The wiring layer 16 is formed on one side of the insulating layer 15. The wiring layer 16 includes via-wirings filled in via-holes 15x penetrating the insulating layer 15 and formed to expose an upper surface of the wiring layer 14 and pads formed on an upper surface of the insulating layer 15. The pads of the wiring layer 16 are electrically connected to the wiring layer 14 through the via-wirings. The via-hole 15x is a concave portion having an inverted conical shape of which a diameter of an opening portion opened toward the solder resist layer 18 is larger than a diameter of a bottom surface of an opening portion formed by the upper surface of the wiring layer 14. A material of the wiring layer 16 and a thickness of the pad are similar to those of the wiring layer 12, for example. In the meantime, a detailed structure of the wiring layer 16 will be described later.

The surface-treated layer 17 is formed on an upper surface of the wiring layer 16. As the surface-treated layer 17, a metal layer may be formed, or an organic film may be formed by performing antioxidant processing such as OSP (Organic Solderability Preservative) processing. As the metal layer, an Au layer, a Ni/Au layer (a metal layer having a Ni layer and an Au stacked in corresponding order), a Ni/Pd/Au layer (a metal layer having a Ni layer, a Pd layer and an Au layer stacked in corresponding order), a Sn layer and the like may be exemplified. In the meantime, the surface-treated layer 17 is a layer that is optionally formed, as required. That is, the formation of the surface-treated layer 17 is not necessarily required.

The solder resist layer 18 is an outermost layer on one side of the wiring substrate 1, and is formed on the upper surface of the insulating layer 15 so as to cover the wiring layer 16 and the surface-treated layer 17. The solder resist layer 18 may be formed of a photosensitive resin of which a main component is an epoxy-based resin, an acryl-based resin or the like, for example. A thickness of the solder resist layer 18 may be set to about 15 to 35 μm, for example.

The solder resist layer 18 has opening portions 18x, and parts of an upper surface of the surface-treated layer 17 are exposed to bottom portions of the opening portions 18x. A planar shape of the opening portion 18x is circular, for example. In the meantime, a tip end-side of the wiring layer 16 and the surface-treated layer 17 may extend beyond an upper surface of the solder resist layer 18. In this case, inner wall surfaces of the opening portions 18x cover parts of a side surface of the wiring layer 16.

The insulating layer 23 is formed on the other surface 10b of the core layer 10 so as to cover the wiring layer 22. A material and a thickness of the insulating layer 23 are similar to those of the insulating layer 13, for example. The insulating layer 23 may contain a filler such as silica ($SiO_2$).

The wiring layer 24 is formed on the other side of the insulating layer 23. The wiring layer 24 includes via-wirings filled in via-holes 23x penetrating the insulating layer 23 and formed to expose a lower surface of the wiring layer 22, and a wiring pattern formed on a lower surface of the insulating layer 23. The wiring pattern of the wiring layer 24 is electrically connected to the wiring layer 22 through the via-wirings. The via-hole 23x is a concave portion having a conical shape of which a diameter of an opening portion opened toward the insulating layer 25 is larger than a diameter of a bottom surface of an opening portion formed by the lower surface of the wiring layer 22. A material and a thickness of the wiring layer 24 are similar to those of the wiring layer 12, for example.

The insulating layer 25 is formed on the lower surface of the insulating layer 23 so as to cover the wiring layer 24. A material and a thickness of the insulating layer 25 are similar to those of the insulating layer 13, for example. The insulating layer 25 may contain a filler such as silica ($SiO_2$).

The wiring layer 26 is formed on the other side of the insulating layer 25. The wiring layer 26 includes via-wirings filled in via-holes 25x penetrating the insulating layer 25 and formed to expose a lower surface of the wiring layer 24, and a wiring pattern formed on a lower surface of the insulating layer 25. The wiring pattern of the wiring layer 26 is electrically connected to the wiring layer 24 through the via-wirings. The via-hole 25x is a concave portion having a conical shape of which a diameter of an opening portion opened toward the solder resist layer 28 is larger than a diameter of a bottom surface of an opening portion formed by the lower surface of the wiring layer 24. A material and a thickness of the wiring layer 26 are similar to those of the wiring layer 12, for example.

The solder resist layer 28 is an outermost layer on the other side of the wiring substrate 1, and is formed on a lower surface of the insulating layer 25 so as to cover the wiring layer 26. A material and a thickness of the solder resist layer 28 are similar to those of the solder resist layer 18. The solder resist layer 28 has opening portions 28x, and parts of a lower surface of the wiring layer 26 are exposed in the opening portions 28x. A planar shape of the opening 28x is circular, for example. The wiring layer 26 exposed in the opening portions 28x may be used as a pad for electrical connection with a mounting substrate (not shown) such as a motherboard. If necessary, the lower surface of the wiring layer 26 exposed in the opening portions 29x may be formed with the above-described metal layer or may be formed with an organic film by performing the antioxidant processing such as OSP processing.

Herein, the wiring layer 16 is described in detail. As shown in FIG. 1B, the wiring layer 16 has a plurality of pad structures 16P. Each of the pad structures 16P includes a via-wiring 16A and a pad 16B for semiconductor chip connection. The via-wiring 16A is filled in the via-hole 15x, which penetrates the insulating layer 15 and is formed to expose the upper surface of the wiring layer 14. The pad 16B for semiconductor chip connection is formed on the upper surface of the insulating layer 15 and formed integrally with the via-wiring 16A. A planar shape of the via-wiring 16A and the pad 16B is circular, respectively, for example. In the below, a case in which the planar shapes of the via-wiring 16A and the pad 16B are respectively circular is described.

The plurality of pad structures 16P includes pad structures of which pad diameters and diameters of via-wirings (hereinbelow, referred to as 'via-wiring diameter') are different. For example, in the pad structure 16P on the left side in FIG. 1B, the pad diameter ϕ11 is about 40 to 50 μm, and the via-wiring diameter ϕ12 is about 20 to 30 μm. Also, in the pad structure 16P on the right side in FIG. 1B, the pad diameter ϕ11 is about 60 to 80 μm, and the via-wiring diameter ϕ22 is about 40 to 50 μm.

Each pad structure 16P included in the wiring layer 6 includes a first metal layer 161, a second metal layer 162, and a third metal layer 163.

The first metal layer 161 is continuously formed on the upper surface of the insulating layer 15, on the inner wall surface of the via-hole 15x, and on the upper surface of the wiring layer 14 exposed in the via-hole 15x. A material of the first metal layer 161 is, for example, copper. A thickness of the first metal layer 161 is, for example, 1 μm or less.

The second metal layer 162 is formed on the first metal layer 161. The second metal layer 162 fills the via-hole 15x and extends upwardly beyond the upper surface of the insulating layer 15. A thickness of a part of the second metal layer 162 formed outside of the via-hole 15x is thicker than the first metal layer 161, and is, for example, about 1 to 5 μm.

The third metal layer 163 is formed on an upper surface of the second metal layer 162. A thickness of the third metal layer 163 is constant, and is, for example, about 10 to 30 μm.

The second metal layer 162 and the third metal layer 163 are formed of the same metal material such as copper. Even in a case in which the second metal layer 162 and the third metal layer 163 are formed of the same metal material, the boundary between them can be recognized. The second metal layer 162 and the third metal layer 163 have a circular planar shape, respectively, and cross-sectional areas thereof are the same. That is, the second metal layer 162 and the third metal layer 163 have a circular column shape. In the meantime, the first metal layer 161 may be formed of the same metal material as the second metal layer 162 and the third metal layer 163. Also, a cross-sectional area of the first metal layer 161 may be the same as those of the second metal layer 162 and the third metal layer 163.

In the meantime, the cross-sectional area means an area of a cross-section taken in a direction orthogonal to a direction in which the second metal layer 162 and the third metal layer 163 are stacked. For example, in a case in which the second metal layer 162 and the third metal layer 163 have a circular column shape, the cross-sectional area is an area of a circular cross-section taken in a direction orthogonal to the direction in which the second metal layer 162 and the third metal layer 163 are stacked.

The upper surface of the second metal layer 162 is flat, so that positions on the upper surfaces of the second metal layers 162 of the pad structures 16P are on the same plane even in the pad structures 16P of which the pad diameters and the via-wiring diameters are different. That is, a distance from the upper surface of the insulating layer 15 to the upper surface of the second metal layer 162 is constant, irrespective of the pad diameters and the via-wiring diameters. For example, in FIG. 1B, the pad diameter and the via-wiring diameter of the pad structure 16P on the left side is smaller than the pad diameter and the via-wiring diameter of the pad structure 16P on the right side; however, a distance from the upper surface of the insulating layer 15 to the upper surface of the second metal layer 162 of the pad structure 16P on the left side is the same as a distance from the upper surface of the insulating layer 15 to the upper surface of the second metal layer 162 of the pad structure 16P on the right side. Since a thickness of the third metal layer 163 is constant, a distance from the upper surface of the insulating layer 15 to an upper surface of the third metal layer 163 is constant, irrespective of the pad diameters and the via-wiring diameters of the pad structures 16P. As used herein, the description "flat", "on the same plane", "constant" and the like include a case in which there is an error in degree of manufacturing variation.

[Manufacturing Method of Wiring Substrate of First Embodiment]

Figure 2A:
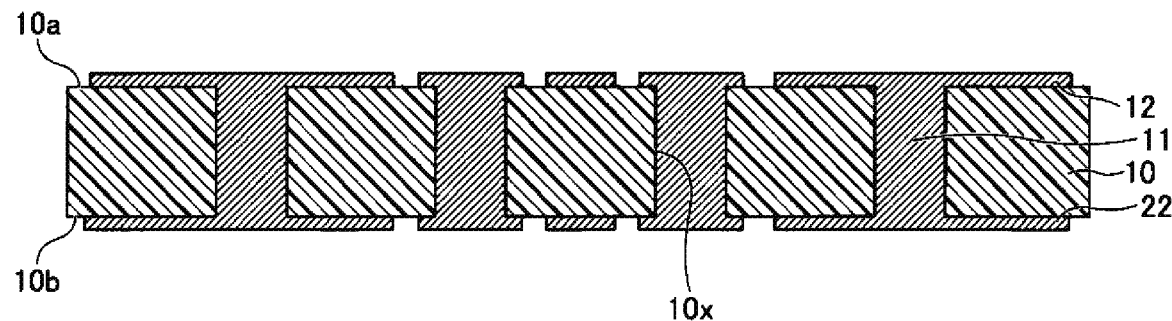
FIGS. 2A to 2C are views exemplifying a manufacturing process of the wiring substrate in accordance with the first embodiment (1 thereof).
Figure 2B:
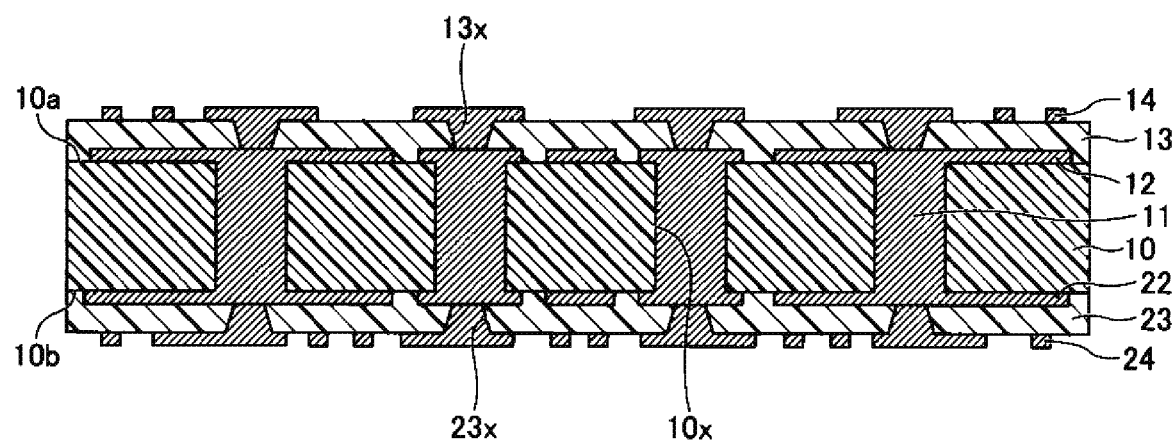
Figure 2C:
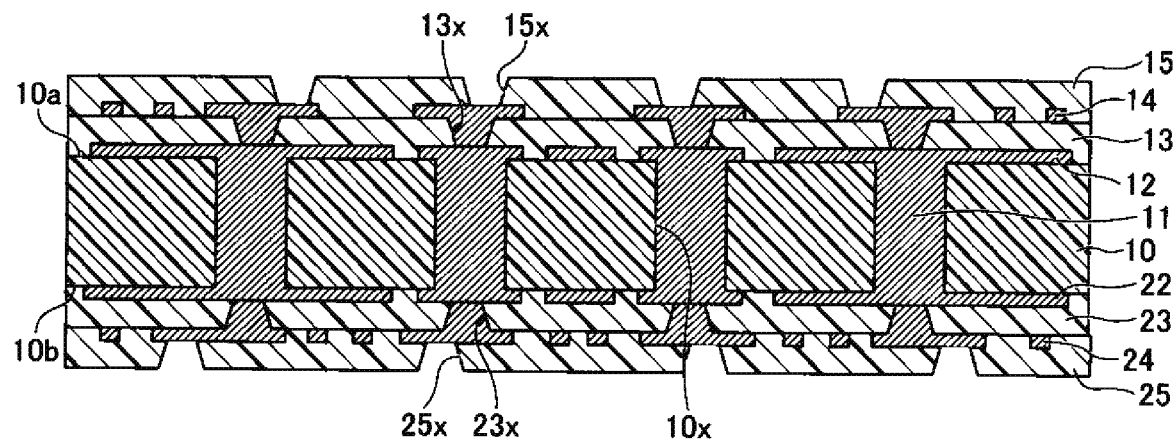

Subsequently, a manufacturing method of the wiring substrate of the first embodiment is described. FIGS. 2A to 4D exemplify manufacturing processes of the wiring substrate of the first embodiment. FIGS. 2A to 2C are sectional views corresponding to FIG. 1A, and FIGS. 3A to 4D are sectional views corresponding to FIG. 1B. In the meantime, an example of the process for manufacturing one wiring substrate is herein described. However, a plurality of parts becoming wiring substrates may be manufactured and divided into individual parts to make the respective wiring substrates.

First, in a process of FIG. 2A, a core layer 10 is formed with through-wirings 11 and wiring layers 12 and 22. Specifically, for example, a deposited plate where plain copper foils are formed on one surface 10a and the other surface 10b of the core layer 10 is prepared. The plain copper foils are copper foils which are not patterned. The core layer 10 is such as a so-called glass epoxy substrate. The copper foils on the respective surfaces of the prepared deposited plate are made to be thin, as required. Then, through-holes 10x, which penetrates the core layer 10 and the copper foils on the respective surfaces, are formed by a laser processing method of using $CO_2$ laser or the like.

Then, desmear processing is performed to remove the remaining resin included in the core layer 10, which is attached to the inner wall surfaces of the through-holes 10x, as needed. Then, a seed layer (copper or the like) configured to cover the copper foils on the respective surfaces and the inner wall surfaces of the through-holes 10x is formed by an electroless plating method, a sputter method or the like, for example. An electrolytic plated layer (copper or the like) is formed on the seed layer by an electrolytic plating method in which the seed layer is used as a power feeding layer. Thereby, the through-holes 10x are filled by the electrolytic plated layer formed on the seed layer, and wiring layers 12 and 22 in which the copper foil, the seed layer and the electrolytic plated layer are stacked are formed on one surface 10a and the other surface 10b of the core layer 10.

Then, the wiring layers 12 and 22 are patterned into a predetermined planar shape by a subtractive method or the like.

Subsequently, in a process of FIG. 2B, one surface 10a of the core layer 10 is formed with an insulating layer 13 by laminating a non-photosensitive thermosetting resin of which a main component is a semi-cured film-like epoxy-based resin, polyimide-based resin or the like so as to cover the wiring layer 12 and curing the same. Also, the other surface 10b of the core layer 10 is formed with an insulating layer 23 by laminating a non-photosensitive thermosetting resin of which a main component is a semi-cured film-like epoxy-based resin, polyimide-based resin or the like so as to cover the wiring layer 22 and curing the same. Alternatively, instead of the laminating of the film-like epoxy-based resin or the like, a liquid form or paste-like epoxy-based resin or the like may be applied and cured to form the insulating layers 13 and 23. A thickness of each of the insulating layers 13 and 23 may be set to about 30 to 40 μm, for example. Each of the insulating layers 13 and 23 may contain a filler such as silica ($SiO_2$).

Then, the insulating layer 13 is formed with via-holes 13x penetrating the insulating layer 13 and configured to expose an upper surface of the wiring layer 12. Also, the insulating layer 23 is formed with via-holes 23x penetrating the insulating layer 23 and configured to expose a lower surface of the wiring layer 22. The via-holes 13x and 23x may be formed by a laser processing method of using $CO_2$ laser or the like, for example. After forming the via-holes 13x and 23x, desmear processing is preferably performed to remove the remaining resin attached to surfaces of the wiring layers 12 and 22 exposed to bottom portions of the via-holes 13x and 23x.

In the meantime, the insulating layers 13 and 23 may be formed of a photosensitive resin of which a main component is an epoxy-based resin, an acryl-based resin or the like. In this case, the via-holes 13x and 23x may be formed by a photolithography method. This applies to the other insulating layers, too.

Subsequently, a wiring layer 14 is formed on one side of the insulating layer 13. The wiring layer 14 includes via-wirings filled in the via-holes 13x, and a wiring pattern formed on an upper surface of the insulating layer 13. A material of the wiring layer 14 and a thickness of the wiring pattern are similar to those of the wiring layer 12, for example. The wiring pattern of the wiring layer 14 is electrically connected to the wiring layer 12 exposed to the bottom portions of the via-holes 13x.

Also, a wiring layer 24 is formed on the other side of the insulating layer 23. The wiring layer 24 includes via-wirings filled in the via-holes 23x and a wiring pattern formed on a lower surface of the insulating layer 23. A material of the wiring layer 24 and a thickness of the wiring pattern are similar to those of the wiring layer 12, for example. The wiring layer 24 is electrically connected to the wiring layer 22 exposed to the bottom portions of the via-holes 23x. The wiring layers 14 and 24 may be formed using a variety of wiring forming methods such as a semi-additive method, a subtractive method and the like.

Subsequently, in a process of FIG. 2C, an insulating layer 15 is formed on the upper surface of the insulating layer 13 so as to cover the wiring layer 14 by the similar formation method to the insulating layer 13. A material and a thickness of the insulating layer 15 are similar to those of the insulating layer 13, for example. Then, via-holes 15x are formed by the similar method to the via-hole 13x. Also, an insulating layer 25 is formed on the lower surface of the insulating layer 13 so as to cover the wiring layer 24 by the similar formation method to the insulating layer 13. A material and a thickness of the insulating layer 25 are similar to those of the insulating layer 13, for example. Then, via-holes 25x are formed by the similar method to the via-hole 13x.

Figure 3A:
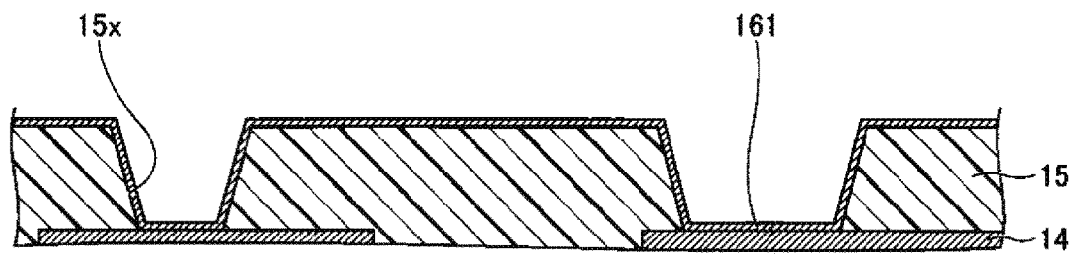
FIGS. 3A to 3D are views exemplifying a manufacturing process of the wiring substrate in accordance with the first embodiment (2 thereof).

Subsequently, in a process of FIG. 3A, a first metal layer 161 to become a seed layer is continuously formed on a surface of the insulating layer 15 including inner walls of the via-holes 15x and on a surface of the wiring layer 14 exposed in the via-holes 15x. A material of the first metal layer 161 is, for example, copper. A thickness of the first metal layer 161 is, for example, 1 μm or less. The first metal layer 161 may be formed by an electroless plating method or a sputter method, for example.

Figure 3B:
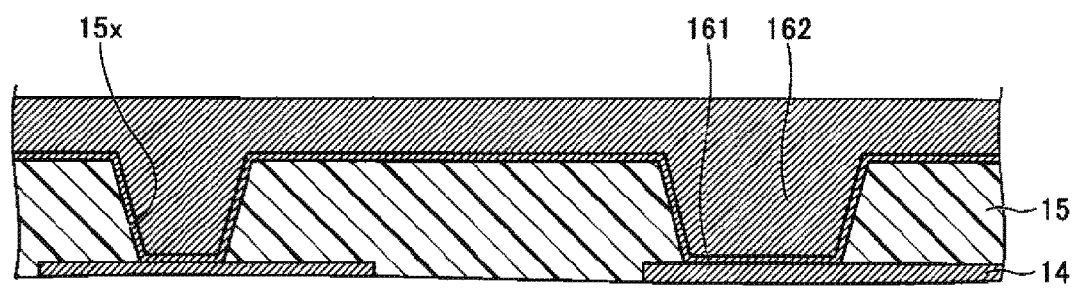

Subsequently, in a process of FIG. 3B, an electrolytic plated layer formed of copper or the like is formed on the first metal layer 161 by an electrolytic plating method in which power is fed from the first metal layer 161, so that a second metal layer 162 is formed. The second metal layer 162 fills the via-holes 15x, and is formed to extend upwardly beyond an upper surface of the insulating layer 15. Specifically, the electrolytic plating is stopped at a point of time at which a thickness of a part of the second metal layer 162 formed outside of the via-holes 15x is substantially uniform over an entire surface. The thickness of the part of the second metal layer 162 formed outside of the via-holes 15x is, for example, about 10 μm.

Subsequently, in a process of FIG. 3C, the second metal layer 162 is thinned to be entirely uniform. The upper surface of the second metal layer 162 after the thinning is flat, so that positions on the upper surfaces of the second metal layers 162 of the pad structures are on the same plane with each other even in pad structures of which pad diameters and via-wiring diameters are different. That is, a distance from the upper surface of the insulating layer 15 to the upper surface of the second metal layer 162 is constant, irrespective of the pad diameters and the via-wiring diameters. After the thinning, the thickness of the part of the second metal layer 162 formed outside of the via-holes 15x is, for example, about 1 to 5 μm. As the thinning method, etching, buffing, CMP (Chemical Mechanical Polishing) and the like may be used, for example.

Subsequently, in a process of FIG. 3D, a resist pattern 300 having opening portions 300x each conforming to a shape of a third metal layer 163 is formed on the upper surface of the second metal layer 162 after the thinning. As the resist pattern 300, for example, a photosensitive dry film resist may be used. The opening portions 300x may be formed by a photolithography method, for example.

Figure 4A:
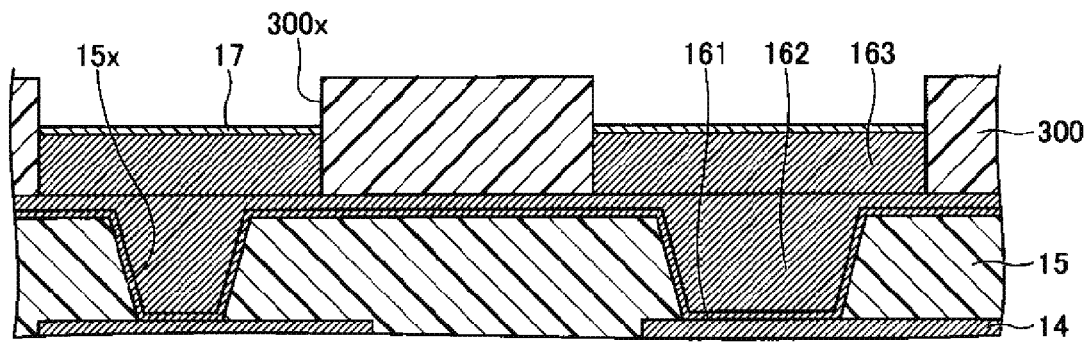
FIGS. 4A to 4D are views exemplifying a manufacturing process of the wiring substrate in accordance with the first embodiment (3 thereof).

Subsequently, in a process of FIG. 4A, an electrolytic plated layer formed of copper or the like is formed on the second metal layer 162 by an electrolytic plating method in which power is fed from the first metal layer 161 and the second metal layer 162, so that a third metal layer 163 is selectively formed in the opening portions 300x. A thickness of the third metal layer 163 is constant, and is for example, about 10 to 30 μm. A distance from the upper surface of the insulating layer 15 to an upper surface of the third metal layer 163 is constant, irrespective of the pad diameters and the via-wiring diameters. Subsequently, a surface-treated layer 17 is formed on the upper surface of the third metal layer 163 by the similar electrolytic plating method to the above method. The surface-treated layer 17 is as described above. However, the surface-treated layer 17 may also be formed by an electroless plating method.

Figure 4B:
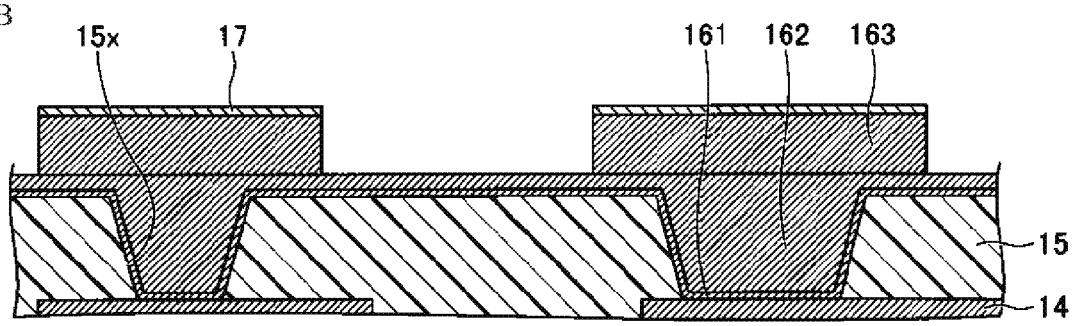

Subsequently, in a process of FIG. 4B, the resist pattern 300 is removed. The resist pattern 300 may be removed using a peeling solution, for example.

Figure 4C:
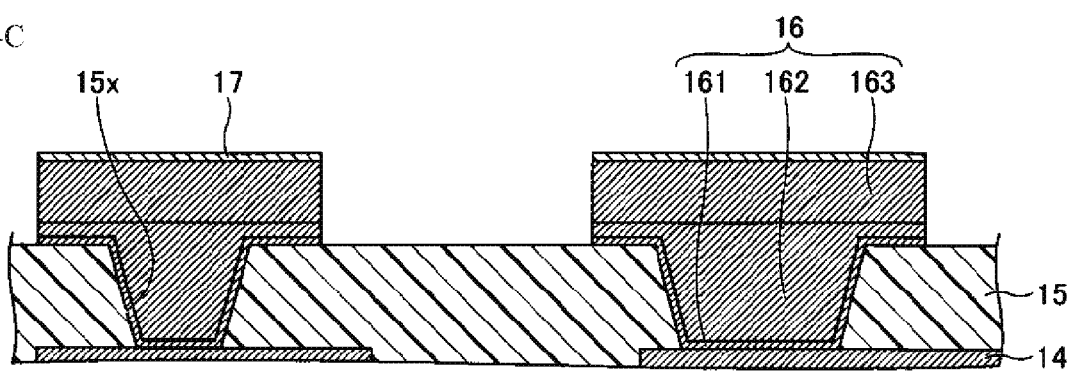

Subsequently, in a process of FIG. 4C, the first metal layer 161 and the second metal layer 162 exposed from the third metal layer 163 are removed by performing an etching process in which the third metal layer 163 is used as a mask. In a case in which the first metal layer 161 and the second metal layer 162 are formed of copper, a hydrogen peroxide/sulfuric acid-based aqueous solution, a sodium persulfate aqueous solution, an ammonium persulfate aqueous solution or the like may be used as an etching solution. By the above processes, a wiring layer 16 having a plurality of pad structures 16P each of which includes a via-wiring 16A and a pad 16B is obtained.

In the meantime, although not shown, a wiring layer 26 is formed on the other side of an insulating layer 25 between the processes of FIGS. 3A to 4C. The wiring layer 26 includes via-wirings filled in via-holes 25x, and a wiring pattern formed on a lower surface of the insulating layer 25. A material of the wiring layer 26 and a thickness of the wiring pattern are similar to those of the wiring layer 12, for example. The wiring layer 26 is electrically connected to the wiring layer 24 exposed to bottom portions of the via-holes 25x. The wiring layer 26 may be formed using a variety of wiring forming methods such as a semi-additive method, a subtractive method and the like.

Figure 4D:
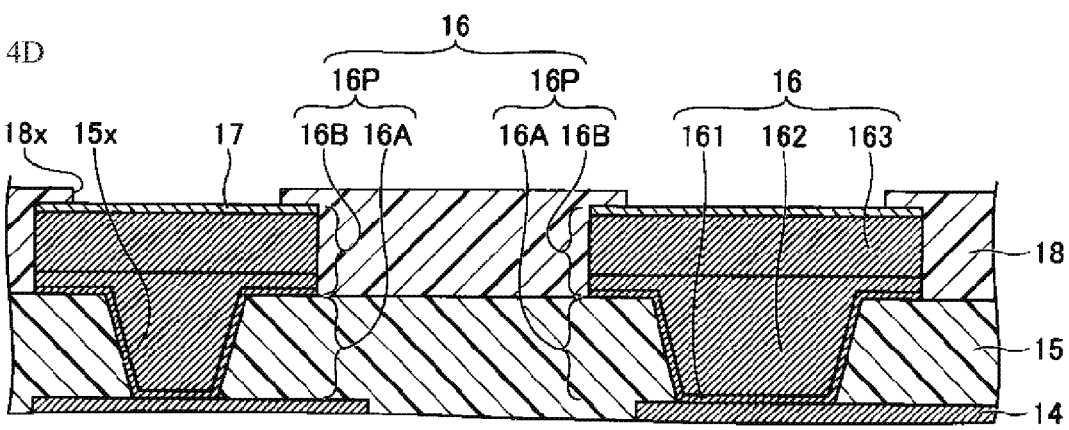

Subsequently, in a process of FIG. 4D, a solder resist layer 18 is formed on the upper surface of the insulating layer 15 so as to cover the wiring layer 16 and the surface-treated layer 17. Also, a solder resist layer 28 is formed on the lower surface of the insulating layer 25 so as to cover the wiring layer 26. The solder resist layer 18 may be formed by applying a liquid form or paste-like photosensitive epoxy-based insulating resin or acryl-based insulating resin to the upper surface of the insulating layer 15 so as to cover the wiring layer 16 and the surface-treated layer 17 by a screen printing method, a roll coat method, a spin coat method or the like. Alternatively, for example, the solder resist layer 18 may be formed by laminating a film-like photosensitive epoxy-based insulating resin or acryl-based insulating resin on the upper surface of the insulating layer 15 so as to cover the wiring layer 16 and the surface-treated layer 17. The formation method of a solder resist layer 28 is similar to that of the solder resist layer 19.

Subsequently, by exposing and developing the solder resist layers 18 and 28, the solder resist layer 18 is formed with opening portions 18x configured to expose portions of the upper surface of the surface-treated layer 17 (photolithography method), Also, the solder resist layer 28 is formed with opening portions 28x configured to expose portions of the lower surface of the wiring layer 26 (photolithography method). In the meantime, the opening portions 18x and 28x may be formed by laser processing or blast processing, too. In this case, the photosensitive material may not be used for the solder resist layers 18 and 28. A planar shape of each of the opening portions 18x and 28x is circular, for example. A diameter of each of the opening portions 18x and 28x may be arbitrarily designed in conformity with a connection target (a semiconductor chip, a motherboard and the like). By the above processes, a wiring substrate 1 is completed.

Figure 3C:
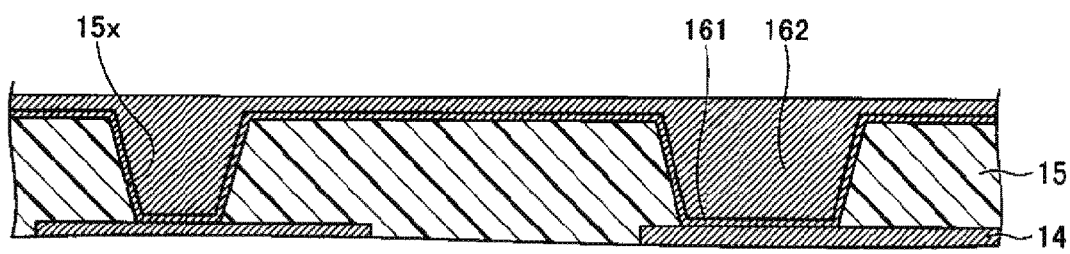
Figure 3D:
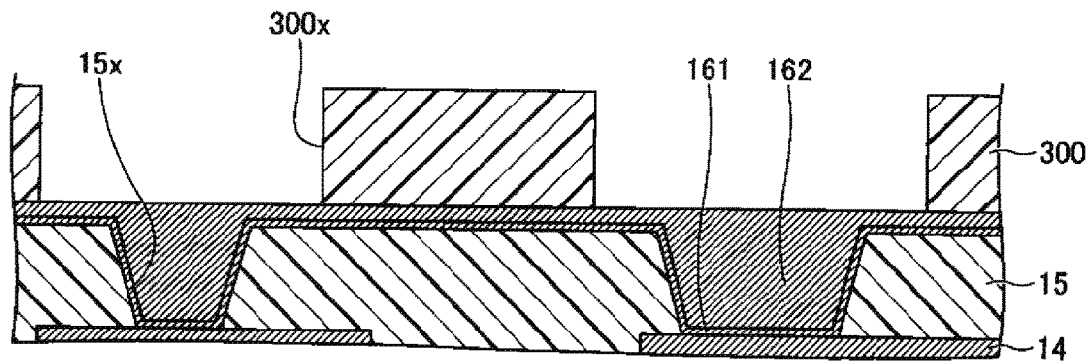

As described above, in the process of FIG. 3B, the second metal layer 162 is formed thick so as to fill the via-holes 15x and to extend upwardly beyond the upper surface of the insulating layer 15, and in the process of FIG. 3C, the second metal layer 162 is uniformly thinned as a whole. Then, in the processes of FIG. 3D to 4A, the upper surface of the second metal layer 162 after the thinning is formed with the third metal layer 163.

Thereby, the second metal layer 162 fills the via-holes 15x and extends upwardly beyond the upper surface of the insulating layer 15, so that the upper surface thereof is flat. At this time, the distance from the upper surface of the insulating layer 15 to the upper surface of the second metal layer 162 is constant, irrespective of the pad diameters and the via-wiring diameters. Then, the flat upper surface of the second metal layer 162 is formed with the third metal layer 163 having a constant thickness.

That is, even when the pad structures P of which the pad diameters and the via-wiring diameters are different coexist in the wiring layer 16, the distance from the upper surface of the insulating layer 15 to the upper surface of the third metal layer 163 is constant. In other words, even when the pad structures P of which the pad diameters and the via-wiring diameters are different coexist, the thickness of the wiring layer 16 with respect to the upper surface of the insulating layer 15 is constant.

As a result, when mounting a semiconductor chip on the wiring substrate 1, intervals between the upper surface of the wiring layer 16 (the upper surface of the third metal layer 163) and electrode pads of the semiconductor chip are constant. Thereby, an amount of soldering necessary for connection of the wiring substrate 1 and the semiconductor chip is secured, so that a possibility of an open defect is reduced. Also, an excessive amount of soldering does not occur, so that a possibility of a short defect is reduced. Accordingly, it is possible to improve connection reliability of the wiring substrate 1 and the semiconductor chip.

In the above, the case in which the pad structures P of which the pad diameters and the via-wiring diameters are different intentionally (in design) coexist in the wiring layer 16 has been described. However, even in a case in which the pad structures P of which the pad diameters and the via-wiring diameters are different do not coexist in design in the wiring layer 16 and the via-wiring diameters are not uniform due to factors such as manufacturing variations, it is possible to improve connection reliability of the wiring substrate 1 and the semiconductor chip by the similar reasons as described above.

Second Embodiment

In a second embodiment, an example of a semiconductor package in which a semiconductor chip is mounted on the wiring substrate of the first embodiment is described. Meanwhile, in the second embodiment, the descriptions of the same constitutional components as the present embodiment described already may be omitted.

Figure 5:
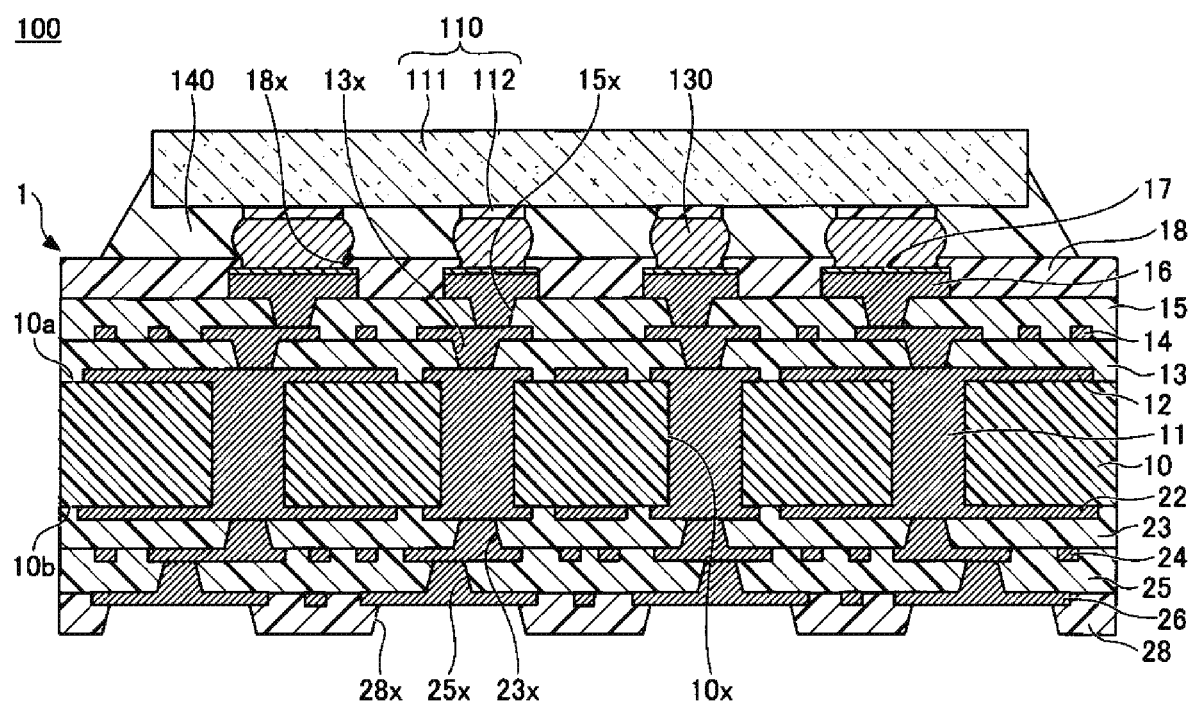
FIG. 5 is a sectional view exemplifying a semiconductor package in accordance with a second embodiment.

FIG. 5 is a sectional view exemplifying a semiconductor package in accordance with the second embodiment. Referring to FIG. 5, a semiconductor package 100 includes the wiring substrate 1 shown in FIG. 1A, a semiconductor chip 110, bumps 130, and an under-fill resin 140.

The semiconductor chip 110 has such a structure that a semiconductor integrated circuit (not shown) and the like are formed on a thin semiconductor substrate 111 formed of silicon or the like, for example. The semiconductor substrate 111 is formed with electrode pads 120 electrically connected to the semiconductor integrated circuit (not shown).

The semiconductor chip 110 is flip-chip mounted on the wiring substrate 1. Specifically, the electrode pads 112 of the semiconductor chip 110 and the surface-treated layer 17 of the wiring substrate 1 are electrically connected by the bumps 130. The under-fill resin 140 is filled between the semiconductor chip 110 and the upper surface of the wiring substrate 1 (the upper surface of the solder resist layer 18). The bumps 130 are, for example, solder bumps. As a material of the solder bump, an alloy including Pb, an alloy of Sn and Cu, an alloy of Sn and Ag, an alloy of Sn, Ag and Cu and the like may be used.

In this way, the semiconductor package 100 in which the semiconductor chip 110 is mounted on the wiring substrate 1 of the first embodiment can be implemented. When mounting the semiconductor chip 110 on the wiring substrate 1, the connection reliability of the wiring substrate 1 and the semiconductor chip 110 can be improved because the intervals between the upper surface of the surface-treated layer 17 and the electrode pads 112 of the semiconductor chip 110 are constant.

Although the preferred embodiments have been described in detail, the present disclosure is not limited to the above embodiments and the embodiments can be diversely modified and replaced without departing from the scope defined in the claims.

For example, in the above embodiments, the present disclosure is applied to the wiring substrate including the core layer manufactured by a buildup process. However, the present disclosure can be applied to a coreless wiring substrate manufactured by the buildup process, too. Also, the present disclosure is not limited thereto, and can be applied to a variety of wiring substrates.

What is claimed is:
1. A wiring substrate comprising:
a first wiring layer;
an insulating layer formed to cover the first wiring layer; and
a second wiring layer connected to the first wiring layer via the insulating layer,
wherein the second wiring layer comprises a plurality of pad structures, each of the pad structures including a via-wiring and a pad for semiconductor chip connection, the via-wiring filled in a via-hole, the via hole penetrating the insulating layer and formed to expose an upper surface of the first wiring layer, the pad for semiconductor chip connection formed on an upper surface of the insulating layer and integrally formed with the via-wiring,
wherein each of the pad structures comprises:
a first metal layer continuously formed on the upper surface of the insulating layer, on an inner wall surface of the via-hole, and on the upper surface of the first wiring layer exposed in the via-hole,
a second metal layer formed on the first metal layer, filling the via-hole, extending upwardly beyond the upper surface of the insulating layer, and having an upper surface being flat, and
a third metal layer formed on an upper surface of the second metal layer,
wherein the plurality of pad structures comprises a first pad structure and a second pad structure, and a via-wiring diameter of the first pad structure is different from a via-wiring diameter of the second pad structure, and
wherein a distance from the upper surface of the insulating layer to the upper surface of the second metal layer of the first pad structure is the same as a distance from the upper surface of the insulating layer to the upper surface of the second metal layer of the second pad structure.

2. The wiring substrate according to claim 1, wherein a pad diameter of the first pad structure is different from a pad diameter of the second pad structure.

3. The wiring substrate according to claim 1, wherein the second metal layer and the third metal layer are formed of a same metal material.

4. The wiring substrate according to claim 3, wherein in each of the pad structure, the third metal layer and a part of the second metal layer forming the pad have a same area of a cross-section taken along a direction orthogonal to a direction in which the second metal layer and the third metal layer are stacked.

5. The wiring substrate according to claim 1, wherein in a direction in which the second metal layer and the third metal layer are stacked, a part of the second metal layer forming the pad is thicker than the first metal layer.

6. A semiconductor package comprising:
the wiring substrate according to claim 1; and
a semiconductor chip mounted on the wiring substrate,
wherein the pads of the wiring substrate and electrode pads of the semiconductor chip are interconnected by soldering.

* * * * *